(12) United States Patent
Negley et al.

(10) Patent No.: US 8,466,611 B2
(45) Date of Patent: Jun. 18, 2013

(54) LIGHTING DEVICE WITH SHAPED REMOTE PHOSPHOR

(75) Inventors: Gerald H. Negley, Durham, NC (US); Antony Paul Van De Ven, Sai Kung (HK)

(73) Assignee: Cree, Inc., Durham, NC (US)

( * ) Notice: Subject to any disclaimer, the term of this patent is extended or adjusted under 35 U.S.C. 154(b) by 668 days.

(21) Appl. No.: 12/636,958

(22) Filed: Dec. 14, 2009

(65) Prior Publication Data
US 2011/0140593 A1    Jun. 16, 2011

(51) Int. Cl.
*H01J 1/62* (2006.01)
*H01J 63/04* (2006.01)

(52) U.S. Cl.
USPC .......................................... 313/502; 313/512

(58) Field of Classification Search
USPC .................... 313/502, 512; 362/84
See application file for complete search history.

(56) References Cited

U.S. PATENT DOCUMENTS

| | | |
|---|---|---|
| 3,875,456 A | 4/1975 | Kano et al. |
| 4,042,552 A | 8/1977 | Grucza |
| 4,081,764 A | 3/1978 | Christmann et al. |
| 4,107,238 A | 8/1978 | Roper et al. |
| 4,141,941 A | 2/1979 | Travnicek |
| 4,320,268 A | 3/1982 | Brown |
| 4,337,506 A | 6/1982 | Terada |
| 4,388,678 A | 6/1983 | Turner |
| 4,562,018 A | 12/1985 | Neefe |
| 4,826,424 A | 5/1989 | Arai et al. |
| 4,918,487 A | 4/1990 | Coulter, Jr. |
| 4,918,497 A | 4/1990 | Edmond |
| 4,933,822 A | 6/1990 | NakaMats |
| 4,966,862 A | 10/1990 | Edmond |
| 4,994,946 A | 2/1991 | NakaMats |
| 5,027,168 A | 6/1991 | Edmond |
| 5,087,949 A | 2/1992 | Haitz |
| 5,110,278 A | 5/1992 | Tait et al. |
| 5,134,550 A | 7/1992 | Young |

(Continued)

FOREIGN PATENT DOCUMENTS

| | | |
|---|---|---|
| CN | 1013388887 A | 1/2009 |
| DE | 102006061164 | 6/2008 |

(Continued)

OTHER PUBLICATIONS

International Search Report and Written Opinion, PCT/US2009/063804, Mailed on Feb. 26, 2010.

(Continued)

*Primary Examiner* — Joseph L Williams
(74) *Attorney, Agent, or Firm* — Koppel, Patrick, Heybl & Philpott (57) ABSTRACT

Solid state lighting (SSL) luminaires are disclosed having remote phosphors arranged to minimize heat degradation and to efficiently convert light. One embodiment of an SSL luminaire includes a light emitting diode (LED) mounted in a base. An enclosure is mounted in relation to the base so that light from the LED emits into the enclosure. A remote phosphor is mounted in the enclosure with at least some light from the LED passing into the remote phosphor where at least some of the light is absorbed and re-emitted at a different wavelength and passing through the enclosure. The remote phosphor is mounted a sufficient distance from the LED so substantially no heat from the LED passes into said conversion material, and wherein the remote phosphor has an open compound shape.

28 Claims, 3 Drawing Sheets

U.S. PATENT DOCUMENTS

| | | | |
|---|---|---|---|
| 5,143,660 A | 9/1992 | Hamilton et al. | |
| 5,210,051 A | 5/1993 | Carter, Jr. | |
| 5,277,840 A | 1/1994 | Osaka et al. | |
| 5,338,944 A | 8/1994 | Edmond et al. | |
| 5,374,668 A | 12/1994 | Kanemura et al. | |
| 5,393,993 A | 2/1995 | Edmond et al. | |
| 5,416,342 A | 5/1995 | Edmond et al. | |
| 5,477,430 A | 12/1995 | LaRose | |
| 5,523,589 A | 6/1996 | Edmond et al. | |
| 5,575,550 A | 11/1996 | Appeldorn et al. | |
| 5,585,640 A | 12/1996 | Huston et al. | |
| 5,604,135 A | 2/1997 | Edmond et al. | |
| 5,631,190 A | 5/1997 | Negley | |
| 5,669,486 A | 9/1997 | Shima | |
| 5,739,554 A | 4/1998 | Edmond et al. | |
| 5,753,730 A | 5/1998 | Nagata et al. | |
| 5,813,753 A | 9/1998 | Vriens et al. | |
| 5,851,063 A | 12/1998 | Doughty et al. | |
| 5,858,278 A | 1/1999 | Itoh et al. | |
| 5,882,553 A | 3/1999 | Prophet et al. | |
| 5,906,425 A | 5/1999 | Gordin et al. | |
| 5,912,477 A | 6/1999 | Negley | |
| 5,962,971 A | 10/1999 | Chen | |
| 5,968,422 A | 10/1999 | Kennedy | |
| 6,066,861 A | 5/2000 | Hohn et al. | |
| 6,069,440 A | 5/2000 | Shimizu et al. | |
| 6,120,600 A | 9/2000 | Edmond et al. | |
| 6,156,242 A | 12/2000 | Saito et al. | |
| 6,177,688 B1 | 1/2001 | Linthicum et al. | |
| 6,187,606 B1 | 2/2001 | Edmond et al. | |
| 6,201,262 B1 | 3/2001 | Edmond et al. | |
| 6,234,648 B1 | 5/2001 | Borner et al. | |
| 6,252,254 B1 | 6/2001 | Soules et al. | |
| 6,329,676 B1 | 12/2001 | Takayama et al. | |
| 6,340,824 B1 | 1/2002 | Komoto et al. | |
| 6,346,973 B1 | 2/2002 | Shibamoto et al. | |
| 6,350,041 B1 | 2/2002 | Tarsa et al. | 362/231 |
| 6,373,188 B1 | 4/2002 | Johnson et al. | |
| 6,383,417 B1 | 5/2002 | Paulson et al. | |
| 6,391,231 B1 | 5/2002 | Evans et al. | |
| 6,404,125 B1 | 6/2002 | Garbuzov et al. | |
| 6,504,301 B1 | 1/2003 | Lowery | |
| 6,521,915 B2 | 2/2003 | Odaki et al. | |
| 6,573,653 B1 | 6/2003 | Ishingaga | |
| 6,576,488 B2 | 6/2003 | Collins, III et al. | |
| 6,576,930 B2 | 6/2003 | Reeh et al. | |
| 6,600,175 B1 | 7/2003 | Baretz et al. | |
| 6,601,984 B2 | 8/2003 | Yamamoto et al. | |
| 6,642,618 B2 | 11/2003 | Yagi et al. | |
| 6,642,652 B2 | 11/2003 | Collins, III et al. | |
| 6,730,939 B2 | 5/2004 | Eisert et al. | |
| 6,734,465 B1 | 5/2004 | Taskar et al. | |
| 6,744,077 B2 | 6/2004 | Trottier | |
| 6,809,347 B2 | 10/2004 | Tasch et al. | |
| 6,841,804 B1 | 1/2005 | Chen et al. | |
| 6,853,131 B2 | 2/2005 | Srivastava et al. | |
| 6,936,857 B2 | 8/2005 | Doxsee et al. | |
| 6,939,481 B2 | 9/2005 | Srivastava et al. | |
| 6,960,878 B2 | 11/2005 | Sakano et al. | |
| 6,963,166 B2 | 11/2005 | Yano et al. | |
| 7,029,935 B2 | 4/2006 | Negley et al. | |
| 7,040,774 B2 | 5/2006 | Beeson et al. | |
| 7,144,131 B2 | 12/2006 | Rains | |
| 7,153,015 B2 | 12/2006 | Brukilacchio | |
| 7,213,940 B1 | 5/2007 | Van de Ven | 362/231 |
| D546,980 S | 7/2007 | Lo et al. | |
| 7,261,441 B2 | 8/2007 | Ng et al. | |
| 7,264,378 B2 | 9/2007 | Loh et al. | |
| D553,267 S | 10/2007 | Yuen | |
| 7,293,908 B2 | 11/2007 | Beeson et al. | |
| 7,360,937 B2 | 4/2008 | Han et al. | |
| 7,479,662 B2 | 1/2009 | Soules et al. | |
| 7,614,759 B2 | 11/2009 | Negley | |
| 7,618,157 B1 | 11/2009 | Galvez | |
| 7,663,315 B1 | 2/2010 | Hulse | |
| 7,686,478 B1 | 3/2010 | Hulse | |
| D629,928 S | 12/2010 | Chen et al. | |
| 2001/0009510 A1 | 7/2001 | Lodhie | |
| 2002/0047516 A1 | 4/2002 | Iwasa et al. | |
| 2002/0093820 A1 | 7/2002 | Pederson | |
| 2002/0123164 A1 | 9/2002 | Slater, Jr. et al. | |
| 2002/0172354 A1 | 11/2002 | Nishi | |
| 2002/0196638 A1 | 12/2002 | Stephens et al. | |
| 2003/0001166 A1 | 1/2003 | Waalib-Singh et al. | |
| 2003/0006418 A1 | 1/2003 | Emerson et al. | |
| 2003/0021113 A1 | 1/2003 | Begemann | |
| 2003/0038291 A1 | 2/2003 | Cao | |
| 2003/0038295 A1 | 2/2003 | Koda | |
| 2003/0067758 A1 | 4/2003 | Shipman | |
| 2003/0111667 A1 | 6/2003 | Schubert | |
| 2003/0113108 A1 | 6/2003 | Bittner | |
| 2003/0128341 A1 | 7/2003 | Li | |
| 2003/0153861 A1 | 8/2003 | Royer | |
| 2003/0165061 A1 | 9/2003 | Martineau | |
| 2003/0173575 A1 | 9/2003 | Eisert et al. | |
| 2004/0012027 A1 | 1/2004 | Keller et al. | |
| 2004/0041222 A1 | 3/2004 | Loh | |
| 2004/0056260 A1 | 3/2004 | Slater, Jr. et al. | |
| 2004/0095763 A1 | 5/2004 | Guerrieri et al. | |
| 2004/0159846 A1 | 8/2004 | Doxsee | |
| 2004/0184270 A1 | 9/2004 | Halter | |
| 2004/0217364 A1 | 11/2004 | Tarsa et al. | |
| 2004/0218391 A1 | 11/2004 | Procter | |
| 2004/0223223 A1 | 11/2004 | Lee | |
| 2004/0252502 A1 | 12/2004 | McCullough et al. | |
| 2005/0057917 A1 | 3/2005 | Yatsuda et al. | |
| 2005/0093430 A1 | 5/2005 | Ibbetson et al. | |
| 2005/0094401 A1 | 5/2005 | Magarill | |
| 2005/0105301 A1 | 5/2005 | Takeda et al. | |
| 2005/0128744 A1 | 6/2005 | You et al. | |
| 2005/0174780 A1 | 8/2005 | Park | |
| 2005/0190559 A1 | 9/2005 | Kragl | |
| 2005/0236628 A1 | 10/2005 | Matsuura | |
| 2005/0242711 A1 | 11/2005 | Bloomfield | |
| 2005/0248958 A1 | 11/2005 | Li | |
| 2006/0006402 A1 | 1/2006 | Hsieh et al. | |
| 2006/0034084 A1 | 2/2006 | Matsuura et al. | |
| 2006/0056169 A1 | 3/2006 | Lodhie et al. | |
| 2006/0061988 A1 | 3/2006 | Johnson et al. | |
| 2006/0092643 A1 | 5/2006 | Wong et al. | |
| 2006/0104060 A1 | 5/2006 | Kragl | |
| 2006/0105482 A1 | 5/2006 | Alferink et al. | |
| 2006/0145172 A1 | 7/2006 | Su et al. | |
| 2006/0181879 A1 | 8/2006 | Pederson | |
| 2006/0209558 A1 | 9/2006 | Chinniah et al. | |
| 2007/0024191 A1 | 2/2007 | Chen et al. | |
| 2007/0139938 A1 | 6/2007 | Petroski | |
| 2007/0206375 A1 | 9/2007 | Lys et al. | |
| 2007/0223219 A1 | 9/2007 | Medendorp | |
| 2007/0263405 A1 | 11/2007 | Ng et al. | |
| 2007/0297179 A1 | 12/2007 | Leung et al. | |
| 2007/0297183 A1 | 12/2007 | Coushaine | |
| 2008/0030993 A1 | 2/2008 | Narendran et al. | |
| 2008/0054281 A1 | 3/2008 | Narendran et al. | |
| 2008/0080165 A1 | 4/2008 | Kim | |
| 2008/0094829 A1 | 4/2008 | Narendran et al. | |
| 2008/0105887 A1 | 5/2008 | Narendran et al. | |
| 2008/0117500 A1 | 5/2008 | Narendran et al. | |
| 2008/0128735 A1 | 6/2008 | Yoo | |
| 2009/0059559 A1 | 3/2009 | Pabst | |
| 2009/0101930 A1 | 4/2009 | Li | |
| 2009/0103293 A1 | 4/2009 | Harbers | |
| 2009/0103296 A1 | 4/2009 | Harbers | |
| 2009/0316383 A1 | 12/2009 | Son | |
| 2009/0322197 A1 | 12/2009 | Helbing | |
| 2010/0025700 A1 | 2/2010 | Jung | |
| 2010/0134047 A1 | 6/2010 | Hasnain | |
| 2010/0155763 A1 | 6/2010 | Donofrio et al. | |
| 2010/0201284 A1 | 8/2010 | Kraus | |
| 2010/0327745 A1 | 12/2010 | Dassanayake et al. | |
| 2010/0328925 A1* | 12/2010 | Hoelen et al. | 362/84 |

FOREIGN PATENT DOCUMENTS

| | | |
|---|---|---|
| DE | 10 2007 037862 A1 | 10/2008 |
| DE | 202008013667 | 12/2008 |
| EP | 0876085 A2 | 11/1998 |
| EP | 1 198 016 | 4/2002 |

| | | |
|---|---|---|
| EP | 1 253 373 | 10/2002 |
| EP | 2154420 | 2/2010 |
| GB | 2 366 610 A | 3/2002 |
| JP | 05-152609 | 6/1993 |
| JP | 06-151974 | 5/1994 |
| JP | 06-177429 | 6/1994 |
| JP | 06-244458 | 9/1994 |
| JP | 07-176794 | 7/1995 |
| JP | 08-007614 | 1/1996 |
| JP | 08-162676 | 6/1996 |
| JP | 09-246603 | 9/1997 |
| JP | 10-242513 | 9/1998 |
| JP | 11-213730 A | 8/1999 |
| JP | 11-261114 | 9/1999 |
| JP | 11-298047 | 10/1999 |
| JP | 2000-101147 | 4/2000 |
| JP | 2000-174347 | 6/2000 |
| JP | 2000-183405 | 6/2000 |
| JP | 2000-286455 | 10/2000 |
| JP | 2000-286458 | 10/2000 |
| JP | 2001-077427 | 3/2001 |
| JP | 2001-077433 | 3/2001 |
| JP | 2001-144334 | 5/2001 |
| JP | 2001-230453 | 8/2001 |
| JP | 2002-118293 | 4/2002 |
| JP | 2002-133938 | 5/2002 |
| JP | 2002-158378 | 5/2002 |
| JP | 2002-223004 | 8/2002 |
| JP | 2002-280616 | 9/2002 |
| JP | 2003-017755 | 1/2003 |
| JP | 2003-347601 | 12/2003 |
| JP | 2004-071357 | 3/2004 |
| JP | 2005-093097 A | 4/2005 |
| JP | 2005-286267 A | 10/2005 |
| JP | 2005021635 | 11/2005 |
| JP | 2005-332963 | 12/2005 |
| JP | 200640850 A | 9/2006 |
| JP | 2009-016058 A | 1/2009 |
| KR | 100980588 B1 | 9/2010 |
| KR | 3020110008445 | 3/2011 |
| TW | D134005 | 3/2010 |
| TW | 100300960 | 3/2011 |
| TW | D141681 | 7/2011 |
| WO | 97/24706 | 7/1997 |
| WO | WO 00/17569 A1 | 3/2000 |
| WO | WO 01/40702 A1 | 6/2001 |
| WO | 01/61764 | 8/2001 |
| WO | 02/059982 | 8/2002 |
| WO | WO 2004100213 A2 | 5/2004 |
| WO | 2005/055328 | 6/2005 |
| WO | 2005/078338 | 8/2005 |
| WO | 2006/039017 | 4/2006 |
| WO | 2007/002234 | 1/2007 |
| WO | WO 2007/130358 A2 | 11/2007 |
| WO | WO 2007146566 A2 | 12/2007 |
| WO | WO 2008/018002 A2 | 2/2008 |
| WO | WO 2008134056 A1 | 4/2008 |
| WO | WO 2008/052318 A1 | 5/2008 |
| WO | WO 2008/117211 A1 | 10/2008 |
| WO | WO 2008/146229 A2 | 12/2008 |
| WO | WO 2009/024952 A2 | 2/2009 |
| WO | WO 2009/091562 A2 | 7/2009 |
| WO | WO 2009/093163 A2 | 7/2009 |
| WO | WO 2009/107052 A1 | 9/2009 |
| WO | WO 2009/119038 A2 | 10/2009 |
| WO | WO 2009/128004 A1 | 10/2009 |
| WO | WO 2009/158422 A1 | 12/2009 |
| WO | WO 2010/012999 A2 | 2/2010 |
| WO | WO 2010052640 | 5/2010 |
| WO | WO 2010/119618 A1 | 10/2010 |
| WO | WO 2010/128419 A1 | 11/2010 |

OTHER PUBLICATIONS

U.S. Appl. No. 12/566,195, Van De Ven, filed Sep. 24, 2009.
U.S. Appl. No. 12/704,730, Van De Ven, filed Feb. 12, 2010.
U.S. Appl. No. 12/901,405, filed Oct. 8, 2010, Tong.
U.S. Appl. No. 61/339,515, filed Mar. 3, 2010, Tong.
U.S. Appl. No. 12/848,825, filed Aug. 2, 2010, Tong.
U.S. Appl. No. 12/975,820, Van De Ven.
U.S. Appl. No. 13/029,063, filed Feb. 16, 2011, Hussell.
U.S. Appl. No. 61/424,670, filed Dec. 19, 2010, Zongjie Yuan.
U.S. Appl. No. 11/656,759, filed Jan. 22, 2007 Chitnis.
U.S. Appl. No. 11/899,790, filed Sep. 7, 2007 Chitnis.
U.S. Appl. No. 11/473,089, filed Jun. 21, 2006 Tarsa.
U.S. Appl. No. 61/435,759, filed Jan. 24, 2011 Le.
U.S. Appl. No. 61/339,516, filed Mar. 3, 2010 Tong.
International Search Report and Written Opinion for PCT/US2011/000400 mailed May 2, 2011.
Cres, XLamp® LEDs, Data Sheet, Dated: 1996-2010, available at http://www.cree.com/Products/xlamp.asp, as retrieved on Apr. 6, 2010.
International Search Report and Written Opinion for PCT Application No. PCT/US2011/000397 mailed May 24, 2011.
International Search Report and Written Opinion for counterpart PCT Application No. PCT/US2010/003146 mailed Jun. 7, 2011.
Decision for Final Rejection for Japanese Patent Application No. 2001-542133 mailed Jun. 28, 2011.
International Search Report and Written Opinion for PCT Application No. PCT/US2011/000399 mailed Jul. 12, 2011.
Decision to Refuse a European Patent Application for EP 09 152 962.8 dated Jul. 6, 2011.
International Search Report and Written Opinion for PCT/US2011/000403 mailed Aug. 23, 2011.
International Search Report and Written Opinion for PCT/US2011/000404 mailed Aug. 25, 2011.
International Search Report and Written Opinion for PCT/US2011/000398 mailed Aug. 30, 2011.
International Search Report and Written Opinion for PCT/US2011/000406 mailed Sep. 15, 2011.
PCT/US06/48875, International Search Report, Feb. 19, 2008.
Craford, "Overview of Device Issues in High-Brightness Light-Emitting Diodes," Chapter, *High Brightness Light Emitting Diodes: Semiconductors and Semimetals*, vol. 48, Stringfellow et al. ed., Academic Press, 1997, pp. 47-63.
"An Even Brighter Idea," Economist.com, http://www.economist.com/science/tq/PrinterFriendly.cfm?story_id=7904236; Sep. 22, 2006 (Science Technology Quarterly) pp. 1-6.
Kim et al., "Strongly Enhanced Phosphor Efficiency in GaInN White Light-Emitting Diodes Using Remote Phosphor Configuration and Diffuse Reflector Cup", Japanese Journal of Applied Physics, vol. 44, Now. 21, 2005, pp. L649-L651.
U.S. Appl. No. 12/465,203, filed May 13, 2009, Pickard.
LEDsMagazine, Remote phosphor technique improves white LED output, Apr. 14, 2005, http://www.ledsmagazine.com/news/2/4/22, pp. 1.
Narendran et al., Extracting phosphor-scattered photons to improve white LED efficiency, Wiley InterScience :: Journals :: physica status solidi (a), Rapid Research Letter, Mar. 17, 2005, http://www3.interscience.wiley.com/journal/110437401/abstract, Abstract.
Narendran, *Improved Performance White LED*, Nov. 2005, Society of Photo-Optical Instrumentation Engineers, Fifth International Conference on Solid State Lighting, Proceedings of SPIE 5941, pp. 1-7.
Narendran, *Improving the performance of mixed-color white LED systems by using scattered photon extraction technique*, 2007 Copyright SPIE, The International Society for Optical Engineering, Seventh International Conference on Solid State Lighting, Proceedings of SPIE, Aug. 27, 2007, pp. 1-2, Sep. 17, 2007.
LRC Solid-State Lighting Papers and Publications, pp. 1-4, Feb. 2, 2006.
U.S. Appl. No. 11/613,692, filed Dec. 20, 2006.
U.S. Appl. No. 11/624,811, filed Jan. 19, 2007.
U.S. Appl. No. 11/870,679, filed Oct. 11, 2007.
U.S. Appl. No. 12/035,604, filed Feb. 22, 2008.
U.S. Appl. No. 11/708,818, filed Feb. 21, 2007.
U.S. Appl. No. 11/476,520, filed Jun. 27, 2006.
U.S. Appl. No. 11/947,323, filed Nov. 29, 2007,
International Search Report and Written Opinion for PCT Patent Application No. PCT/US2011/000405 mailed Nov. 2, 2011.
International Search Report and Written Opinion for PCT/US2011/000407 mailed Nov. 16, 2011.

Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
International Search Report and Written Opinion for PCT Application No. PCT/US2011/000391 mailed Oct. 6, 2011.
International Search Report and Written Opinion for PCT Application No. PCT/US2011/000402 mailed Sep. 30, 2011.
International Search Report and Written Opinion from PCT Application No. PCT/US2012/044705 dated Oct. 9, 2012.
Notice to Submit a Response from Korean Patent Application No. 30-2011-0008446, dated Oct. 22, 2012.
Notice to Submit a Response from Korean Patent Application No. 30-2011-0008448, dated Apr. 16, 2012.
Notice to Submit a Response from Korean Patent Application No. 30-2011-0008445, dated Apr. 16, 2012.
Notice to Submit a Response from Korean Patent Application No. 30-2011-0008446, dated Apr. 16, 2012.
Office Action for Taiwanese Patent Application No. 100300961, dated May 7, 2012.
Office Action from Taiwanese Patent Application No. 100300960, dated May 7, 2012.
Notice to Submit a Response from Korean Design Patent Application No. 30-2011-0024961, dated Sep. 10, 2012.

* cited by examiner

LIGHTING DEVICE WITH SHAPED REMOTE PHOSPHOR

BACKGROUND OF THE INVENTION

1. Field of the Invention

This invention relates to lighting devices and in particular to solid state lighting devices comprising one or more light emitting diodes and remote conversion materials.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package can also include electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to shape the light emitted from the LED chip 12.

LED packages 10 can generate white light by having a blue emitting LED chip 12 covered by a conversion material that absorbs blue light and re-emits yellow light. Some of the blue light passes through the conversion material without being converted such that the LED package 10 emits a white light combination of blue and yellow light. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B. Heat from the LED chip 12 and the surrounding components can also spread into the conversion material, which can degrade the conversion material over time, changing its conversion characteristics. This in turn can result in the LED package 10 emitting different colors of light over time.

Figures 1, 2:
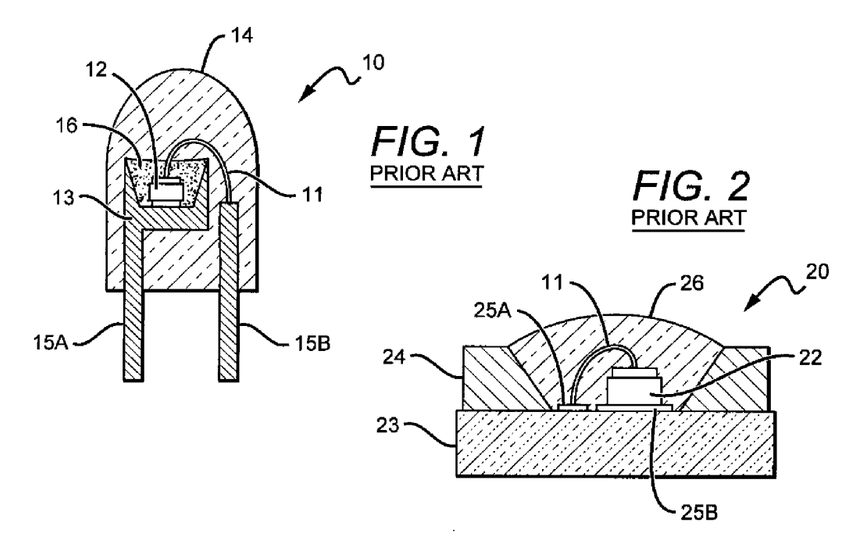
FIG. 1 shows a sectional view of one embodiment of a prior art LED lamp.
FIG. 2 shows a sectional view of another embodiment of a prior art LED lamp.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. One or more of the LED chips 22 can be covered by a conversion material so that the particular LED chip emits a white light combination of light from the LED chip and the conversion material. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips are then covered with an encapsulant 26, which may provide environmental and mechanical protection to the chips while also acting as a lens. The metal reflector 24 is typically attached to the carrier by means of a solder or epoxy bond.

Heat is more efficiently radiated from the LED chips 22 through the metal reflector 24, to the submount 23, and any heat sink. Heat from the LED chips, however, can still spread into the conversion material, causing degradation of the conversion characteristics. Like the package 10 described above, this can result in changing emission characteristics for the LED package over time.

U.S. Pat. No. 6,350,041 to Tarsa, entitled "High Output Radial Dispersing Lamp Using a Solid State Light Source," discloses a number of lamp embodiments comprising one or more solid state light sources at one end of a separator, and a disperser at the other end of the separator. Light from the LED light sources travels down the separator where it can be dispersed in a radial pattern by the disperser. The disperser can also comprise a wavelength conversion material that can convert all or some of the incident light from the light sources. In different embodiments the light sources can emit blue light and the disperser comprises conversion material that absorbs blue light and re-emits yellow light. The light emitting from the disperser can comprise a white light combination of blue light from the light sources and yellow light from the conversion material. In another embodiment, an enclosure can surround the separator and disperser and can contain a yellow phosphor. Blue light from the light sources can be radially dispersed by the disperser and can pass through the enclosure where at least some of the blue light is converted to yellow. The enclosure can then emit a white light combination blue and yellow light from the phosphor.

One characteristic of conversion materials is that directional light that is incident on the conversion material that is absorbed and re-emitted by the conversion material is emitted in all directions. In embodiments where the LED chip is covered by a conversion material, some of the light re-emitted from the conversion material can be directed back toward the package where it can be absorbed. In other embodiments, the re-emitted light can be directed in a path that causes it to pass through additional conversion material where it can be absorbed. In lamps having an enclosure with a conversion material, a portion of the light can be absorbed and re-emitted back inward to the enclosure. The converted light must again pass through the enclosure before it emits from the lamp, and during these additional passes light can be absorbed by the conversion material. This absorption can reduce the overall emission efficiency of lamp.

SUMMARY OF THE INVENTION

The present invention is directed to lamps and luminaires that have remote phosphors positioned in relation to the lamp light sources so heat spreading from the light sources to the remote phosphors is reduced or eliminated. This can reduce the heat degradation of the phosphors. The present invention also provides remote phosphors with shapes that minimize the absorption of light from the phosphor, thereby increasing the overall efficiency of the lamp.

One embodiment of a solid state lighting (SSL) luminaire according to the present invention comprises a solid state light source and a remote phosphor mounted in relation to the light source so that light from the light source passes through the remote phosphor where at least some of the light source light is converted. The remote phosphor has an open compound shape, and is mounted a sufficient distance from the light source so that substantially no heat from the light source passes into the remote phosphor.

One embodiment of a lamp according to the present invention comprises a light emitting diode (LED) and a remote conversion material mounted in relation to the LED so that light from the LED passes through the conversion material where at least some of the LED light is absorbed and re-emitted at a different wavelength. The conversion material is also mounted a sufficient distance from the LED so that heat from the LED does not pass into the conversion material. The conversion material has a shape that minimizes re-emitted light passing into the conversion material.

Another embodiment of a solid state lighting (SSL) luminaire comprises a solid state light source mounted in a base with an enclosure mounted in relation to the base so that light from the light source emits into the enclosure. A remote phosphor is mounted in the enclosure with at least some light from the light source passing into the remote phosphor where at least some of the light is absorbed and re-emitted at a different wavelength. The remote phosphor is mounted a sufficient distance from the light source so substantially no heat from the light source passes into the remote phosphor, and wherein the remote phosphor has a shape that minimizes re-emitted light passing back into the conversion material.

These and other aspects and advantages of the invention will become apparent from the following detailed description and the accompanying drawings which illustrate by way of example the features of the invention.

DETAILED DESCRIPTION OF THE INVENTION

The present invention is directed to the use of shaped remote phosphors to provide more efficient and more uniform color and flux distribution of light from a lamp. The remote phosphors according to the present invention can be arranged to allow for operation of the lamp with minimal or no heat from the light source spreading into the phosphor. The remote phosphor is also arranged to minimize the amount of phosphor re-emitted light the passes through the phosphor material additional times following initial conversion. This reduces the amount of light that is absorbed by the remote phosphor and increases the overall emission efficiency of the lamp.

Embodiments according to the present invention can comprise one or more light emitting diodes (LED or LEDs) whose emission is incident on the remote phosphor so that at least some of the light is absorbed by the phosphor and re-emitted at a different wavelength of light. In one embodiment, the LEDs can emit a blue light, with the remote phosphor absorbing at lease some of the blue LED light and re-emitting a yellow light. The lamp can then emit white light combination of blue and yellow light.

Figure 3:
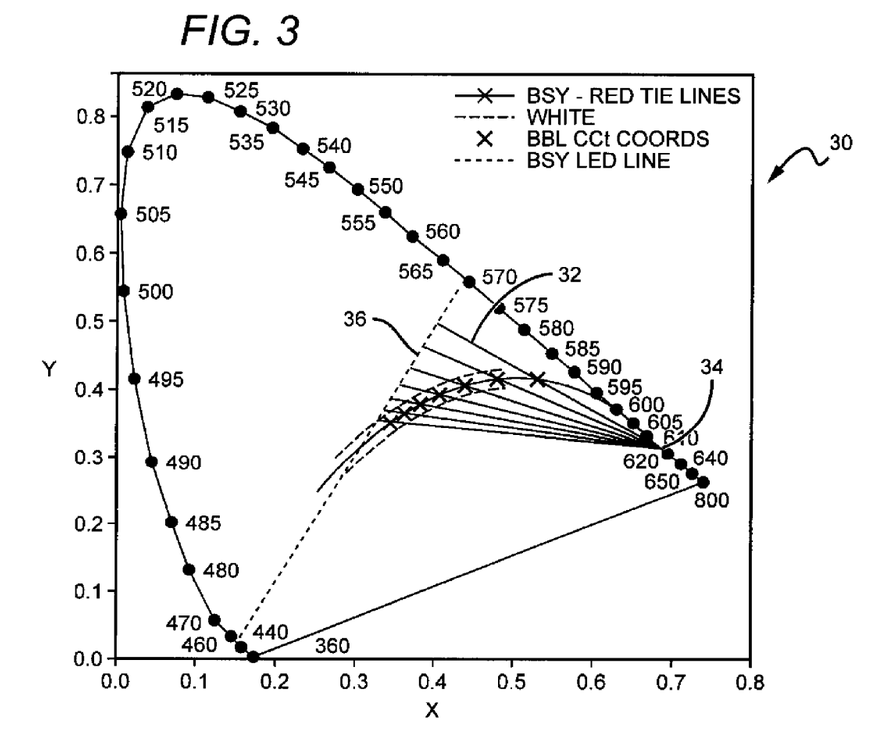
FIG. 3 is a CIE diagram showing the tie lines between BSY and red emitters.

Other embodiments according to the present invention can utilize different techniques for generating white light from a plurality of discrete light sources to provide improved CRI at the desired color temperature. Some of these techniques have been developed that utilize different hues from different discrete light sources, such as those described in U.S. Pat. No. 7,213,940, entitled "Lighting Device and Lighting Method". In one such arrangement the light from one or more 452 nm peak blue InGaN LEDs was converted by a yellow conversion material, such as a YAG:Ce phosphor, to provide a color that was distinctly yellow and had a color point that fell well above the black body locus. The yellow emission was combined with the light from reddish AlInGaP LEDs that "pulled" the yellow color of the yellow LEDs to the black body curve to produce warm white light. FIG. 3 shows a CIE diagram 30 with the tie lines 32 between red light 34 from red emitting LEDs and various yellow and yellowish points on the blue/YAG tie line 36. With this approach, high efficacy warm white light can be produced with improved CRI. Some embodiments exhibited improved efficacy, with CRI Ra of greater than 90 at color temperatures below 3500 K.

Utilizing this approach according to the present invention, a remote YAG:Ce phosphor can be utilized to convert the blue light to yellow. A reddish AlInGaP LED can be included to pull yellow light from the remote phosphor to the black body cure. The remote phosphor can be arranged so that none or a minimal amount of heat from the LEDs passes into the phosphor to avoid heat degradation. The remote phosphor can also be shaped to provide a uniform distribution of light from the lamp while minimizing absorption of re-emitted light. In still other embodiments, the remote phosphor can comprise YAG:CE phosphor and a red phosphor so that the lamp emits the desired CRI and color temperature.

The shape of different embodiments of the remote phosphor can depend on the configuration of the overall lamp. The LED light source may, for example, be self ballasted and can comprise a single chip, such as a blue chip, or multiple chips of the same or different colors. The lamp can have the bulb or other enclosure that in some embodiments can be the shape and size of a standard bulb, although it is understood that the present invention is directed to lamps of many different shapes and sizes. The remote phosphor can be mounted within the enclosure using many different methods so that light from the LED light source is directed towards and passes into the remote phosphor. The remote phosphor may be any suitable color phosphor, such as YAG. The phosphor may be formed into a fixed shape, and in some embodiments the phosphor can be mixed in binders that are mechanically rigid when cured. The remote phosphors can be formed using many different known techniques such as injection molding.

The shape of the remote phosphor should be such that it maximizes the emission uniformity of the re-emitted light while at the same time minimizing the re-emitted light that is absorbed by the remote phosphor. Different embodiments of the remote phosphor can have compound, open shapes that allow for the re-emitted light from the remote phosphor to emit in all directions. That is, the remote phosphor should have one or more angled surfaces to allow for emission sideways, but should not close on itself, such as in a hemispheric enclosure, so the amount of re-emitted light passing into the phosphor a second time is minimized. In some embodiments, the remote phosphor can be substantially planar with sections that curve or bend. In other embodiments the remote phosphor can take other shapes with one such shape being a hyperbolic paraboloid or multiple hyperbolic paraboloids formed into one structure. In different embodiments of hyperbolic paraboloid can have different radiuses of curvature for different portions of the structure.

The remote phosphor can also have different characteristics to provide the desired emission pattern from the lamp. In some embodiments, the remote phosphor can have regions with different thickness, with the sections of greater thickness presenting more phosphor for the light to pass through. In other embodiments the remote phosphor can different concentrations of phosphors in different regions. In other embodiments, the remote phosphor can also have more than one phosphor mixed throughout, or can have different regions of different phosphors. The remote phosphor can also have dispersing agents arranged throughout, or dispersing agents arranged in different concentrations in different regions. The remote phosphor can also have regions that are substantially transparent.

The present invention is described herein with reference to certain embodiments, but it is understood that the invention can be embodied in many different forms and should not be construed as limited to the embodiments set forth herein. In particular, the present invention is described below in regards to certain lamps or lighting components or luminaires that can have one or more LEDs or LED chips in different configurations. These are generally referred to as solid state lighting (SSL) luminaires, but it is understood that the present invention can be used for many other lamps having many different array configurations of different emitter types. The components can have different shapes and sizes beyond those shown and different numbers of LEDs can be included in the lamps.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, and/or sections, these elements, components, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
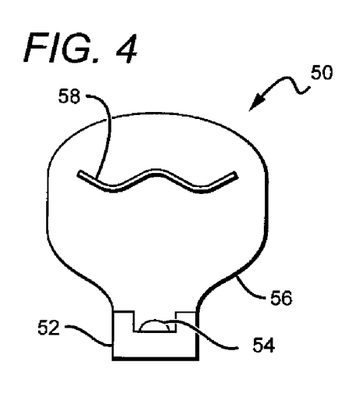
FIG. 4 is a sectional view of one embodiment of a lamp according to the present invention.

It is understood that the arrangements described herein can be utilized in many different luminaires having different features arranged in different ways. FIG. 4 shows one embodiment of lamp 50 comprising a base 52, a light source 54, an enclosure 56 and a remote phosphor 58. The base 52 can be sized and arranged to fit in an electrical receptacle and in some embodiments can be arranged to fit in conventional electrical receptacles. For example, the electrical receptacle can be a standard Edison socket, and the base 52 can comprise a screw-threaded portion which can be screwed into an Edison socket. In other embodiments, the base can be a standard plug and the electrical receptacle can be a standard outlet, or the base can be a GU24 base unit, or it can be a clip and the electrical receptacle can be a receptacle which receives and retains the clip (e.g., as used in many fluorescent lights). These are only a few of the options for the base and receptacles, and different arrangements can be used that safely deliver electricity from the receptacle to the base 52.

The base 52 can comprise a converter that can comprise circuitry to convert a power source to an electrical signal useful for driving the light source 54. In one embodiment the conversion circuitry can comprise a conventional rectifier and high voltage converter. If power of an alternating current (AC) is supplied, the conversion circuitry can convert the AC power and supply energy to the light source 54 in a form that causes the light source 54 to emit light. In one embodiment the AC power can be converted to DC power.

In different embodiments of the present invention the light source 54 can comprise one or more solid state light emitters. Such emitters are known in the art and comprise a wide variety of emitters such as different light emitting diodes (inorganic or organic, including polymer light emitting diodes (PLEDs)), laser diodes, thin film electroluminescent devices, light emitting polymers (LEPs). The operation and manufacture of these emitters is generally known and is not discussed in detail herein. The materials out of which such devices are made are also generally known and as such are not discussed in detail. The light source can comprise one or more commercially available LED based emitters and packages, and in one embodiment the light source can comprise one or more such emitters commercially available from Cree, Inc. in Durham, N.C. These can include but are not limited to Cree's XLamp® LEDs or its MXP LEDs. In the embodiment shown, one LED based light source 54 is utilized, but it is understood that in other embodiments more than one light source can be used.

The lamp 50 further comprises an enclosure 56 that surrounds the remote phosphor 58 and is mounted to the base 52. The enclosure 56 can be made of many different materials, such as glass or plastic, and can have many different shapes and sizes. The enclosure 56 can be transparent to light from the light source 54 and the remote phosphor, or can comprise a diffusing particles or a diffusing surface to help mix the light as it passes through the enclosure 56. In other embodiments portions of the enclosure can be diffusive, while other portions can be transparent or clear. The enclosure 56 can be many different sizes including the sizes corresponding to known standard light bulb sizes. In the embodiment shown, the enclosure 56 fully surrounds and encloses the remote phosphor 58, but it is understood that in different embodiments the enclosure may be less than full and can surround less than all of the remote phosphor 58. Other embodiments can also be arranged without an enclosure.

A remote phosphor 58 is arranged within the enclosure 56 and can comprise one or more conversion materials, typically fixed within a rigid binder material. The remote phosphor is positioned within the enclosure so that light from the light source 54 passes into the remote phosphor where at least some of the light is wavelength converted by the conversion material. The remote phosphor 58 is mounted a sufficient distance from the light source 54 to minimize or eliminate the amount of heat that spreads from the light source to the conversion material in the remote phosphor 58. This in turn minimizes the heat degradation that the conversion material can experience over time. The remote phosphor 58 can be mounted within the enclosure 56 using many different mounting methods and in one embodiment the remote phosphor 58 can be mounted to the inside surface of the enclosure 56 using conventional bonding materials. This is only one of the many methods for mounting the remote phosphor within the enclosure, with some alternative mounting methods described below.

Different materials can be used for the binder in the remote phosphor, with materials preferably being robust after curing and substantially transparent in the visible wavelength spectrum. Suitable material include silicones, epoxies, glass, inorganic glass, spin-on glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

Many different phosphors can be used in the remote phosphor with the present invention being particularly adapted to LED chips emitting white light. As described above, in some embodiments according to the present invention the light source 54 can be LED based and can emit light in the blue wavelength spectrum and the phosphor absorbs some of the blue light and re-emits yellow. The LED chips emit a white light combination of blue and yellow light. In other embodiments according to the present invention, light from a blue LED can be converted by a yellow conversion material, such as a YAG:Ce phosphor, to provide a color that was distinctly yellow and has a color point that above the black body locus on a CIE diagram. A reddish emitting LEDs provides a light that "pulls" the yellow color of the yellow LEDs to the black body curve to produce warm white light as described in U.S. Pat. No. 7,213,940, mentioned above and incorporated by reference in its entirety.

For the blue light converted to yellow a commercially available YAG:Ce phosphor can be used, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:
$Tb_{3-x}RE_xO_{12}$:Ce(TAG); RE=Y, Gd, La, Lu; or
$Sr_{2-x-y}Ba_xCa_ySiO_4$:Eu.

First and second phosphors can also be combined in the remote phosphor 58 for higher CRI white of different white hue (warm white) with the yellow phosphors above combined with red phosphors. Different red phosphors can be used including:
$Sr_xCa_{1-x}S$:Eu, Y; Y=halide;
$CaSiAlN_3$:Eu; or
$Sr_{2-y}Ca_ySiO_4$:Eu Other phosphors can be used to create saturated color emission by converting substantially all light to a particular color. For example, the following phosphors can be used to generate green saturated light:
$SrGa_2S_4$:Eu;
$Sr_{2-y}Ba_ySiO_4$:Eu; or
$SrSi_2O_2N_2$:Eu.

The following lists some additional suitable phosphors used as conversion particles in LED chips 10, although others can be used. Each exhibits excitation in the blue and/or UV emission spectrum, provides a desirable peak emission, has efficient light conversion, and has acceptable Stokes shift:
Yellow/Green
$(Sr,Ca,Ba) (Al,Ga)_2S_4$:$Eu^{2+}$
$Ba_2(Mg,Zn) Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$:Eu
$Ba_2SiO_4$:$Eu^{2+}$
Red
$Lu_2O_3$:$Eu^{3+}$
$(Sr_{2-x}La_x)(Ce_{1-x}Eu_x) O_4$
$Sr_2Ce_{1-x}Eu_xO_4$
$Sr_{2-x}Eu_xCeO_4$
$SrTiO_3$:$Pr^{3+}, Ga^{3+}$
$CaAlSiN_3$:$Eu^{2+}$
$Sr_2Si_5N_8$:$Eu^{2+}$ Different factors determine the amount of LED light that will be absorbed by the conversion material in the remote phosphor, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Different sized phosphor particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. The remote phosphor 54 can also have different concentrations or loading of phosphor materials in the binder, with a typical concentration being in range of 30-70% by weight. In one embodiment, the phosphor concentration is approximately 65% by weight, and is preferably uniformly dispersed throughout the remote phosphor. As discussed in more detail below, the remote phosphor 58 can have different regions with different conversion materials and different concentrations of conversion material.

The remote phosphor 58 can also comprise scattering particles on its surface or within the binder. The remote phosphor can have different concentrations of scattering particles depending on the application and materials used. A suitable range for scattering particle concentration is from 0.01% to 0.2%, but it is understood that the concentration can be higher or lower. In some embodiments the concentration can be as low as 0.001%. For some scattering particles there can be an increase in loss due to absorption for higher concentrations.

Thus, the concentrations of the scattering particles should be chosen in order to maintain an acceptable loss figure. The scattering particles can comprise many different materials including but not limited to:
- silica gel;
- zinc oxide (ZnO);
- yttrium oxide ($Y_2O_3$);
- titanium dioxide ($TiO_2$);
- barium sulfate ($BaSO_4$);
- alumina ($Al_2O_3$);
- fused silica ($SiO_2$);
- fumed silica ($SiO_2$);
- aluminum nitride;
- glass beads;
- zirconium dioxide ($ZrO_2$);
- silicon carbide (SiC);
- tantalum oxide ($TaO_5$);
- silicon nitride ($Si_3N_4$);
- niobium oxide ($Nb_2O_5$);
- boron nitride (BN); or
- phosphor particles (e.g., YAG:Ce, BOSE)

Various combinations of materials or combinations of different forms of the same material may be used to achieve a particular scattering effect.

As discussed above, the remote phosphor 58 can have a shape that enhances emission uniformity of light from the lamp 50 while at the same time minimizing the re-emitted light that is absorbed by the remote phosphor. The light absorbed by the phosphor is minimized by reducing the amount of light that is initially converted and re-emitted by the conversion material within the remote phosphor, from entering the remote phosphor additional times after initial re-emission. This reduces the absorption of the light that can occur during these subsequent passes through the phosphor.

This can be achieved using particular shapes for the remote phosphor 58, and in some embodiments the remote phosphor have compound, open shapes that allow for the re-emitted light from the remote phosphor in all directions. That is, the remote phosphor should have one or more angled surfaces to allow for emission sideways, but should have a minimal number or no surfaces that close on or that face each other. Examples of remote phosphors having surfaces facing on another include hemispheric shaped remote phosphors or enclosures. These phosphors are characterized by having surfaces that face each other where a portion of light re-emitted from the phosphor on one wall emits inward, where it can pass through the enclosure at least a second time before it emits from the lamp. During these subsequent passes the light can be absorbed, reducing the overall emission efficiency the lamp. The embodiments according to the present invention are arranged to minimize these losses.

Figure 5:
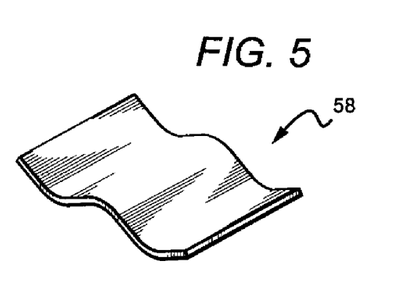
FIG. 5 is a perspective view of one embodiment of a remote phosphor according to the present invention.

Referring now to FIG. 5, the remote phosphor 58 is generally planar, but also includes bends or curves with relatively high radiuses of curvature such that the remote phosphor 58 has a wavy or W-shaped profile. Light from the light source 52 passes into the remove phosphor 58 where it is converted and re-emitted by the conversion material in remote phosphor. Light emits from the remote phosphor in all directions, with light from the bend promoting emission sideways from the remote phosphor 58. At the same time, the bends have a sufficiently large radius of curvature such that the remote phosphor does not have any facing surfaces, which reduces that amount of light that passes through the remote phosphor a second time where it can be absorbed.

It is understood that in different embodiments according to the present invention the remote phosphor 58 can take many different shapes. For example, the remote phosphor 58 as shown in FIG. 4 can have more or fewer bends such that it is U-shaped or V-shaped, or can have different bends with different radiuses of curvature. There can be multiple bends in different locations and different embodiments the remote phosphor can take more complex compound shapes. The remote phosphor 58 is shown as being square, but it is understood that it can take many different shapes including but not limited to circular, oval, rectangular, pentagon, hexagon, octagon, etc.

Figure 6:
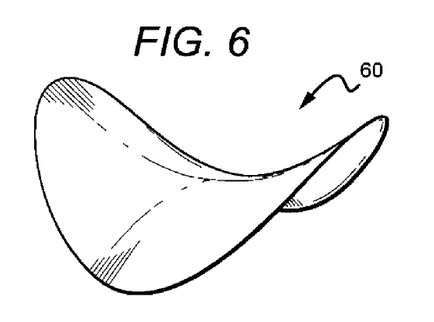
FIG. 6 is a perspective view of another embodiment of a remote phosphor according to the present invention.

FIG. 6 shows an embodiment of a remote phosphor 60 according to the present invention having a more complex shape, with the remote phosphor 60 having a generally hyperbolic paraboloid shape. These shapes generally comprise doubly ruled surface shaped like a saddle, and in most embodiments that radius of curvature for the different sections should be such that there are no facing surfaces or the number of facing surfaces is minimizes. It is generally an open shape and when viewed form the top, the remote phosphor 60 comprises a circular shape. This shape may be more compatible with lamp enclosures having a circular cross-section, but can also be used in other lamps.

Figure 7:
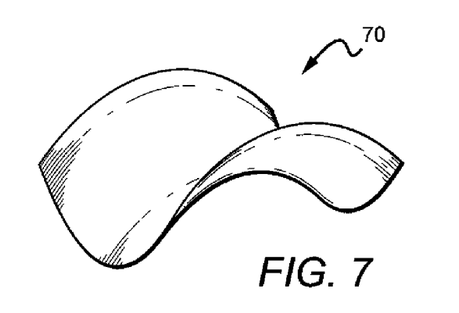
FIG. 7 is a perspective view of another embodiment of a remote phosphor according to the present invention.

FIG. 7 shows another embodiment of a hyperbolic paraboloid shaped remote phosphor 70 that is similar is similar to the remote phosphor 60 in FIG. 6. The remote phosphor 70 also has a generally open shape with the number of facing surfaces minimized or eliminated. In this embodiment, however, the remote phosphor 70 has flat edges, giving the remote phosphor a square shape when viewed from the top. This remote phosphor may be more compatible with enclosures having a square cross-section, although it can also be used in other lamps.

Figure 8:
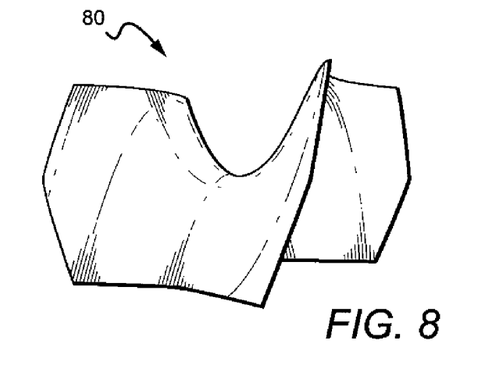
FIG. 8 is perspective view of still another embodiment of a remote phosphor according to the present invention.

It is understood that the remote phosphor can take many different compound shapes beyond those described above. For example, FIG. 8 shows a generally hyperbolic paraboloid shaped remote phosphor 80 according to the present invention having a more complex shape. It is also a generally open shape and comprises multiple edges and surfaces with different radiuses of curvature. The shape provides angled surfaces to promote sideways re-emission from the phosphor, while still minimizing the number of facing surfaces. It is understood that FIGS. 5-8 show only a few examples of the different shapes that can be used for the remote phosphors according to the present invention.

Figure 9:
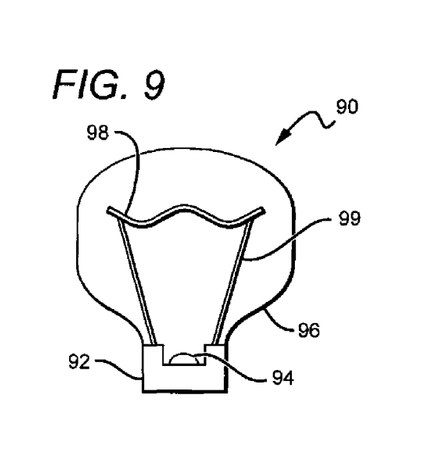
FIG. 9 is a sectional view of another embodiment of a lamp according to the present invention.

In lamp 50 in FIG. 4, the remote phosphor 58 is mounted to the inside of the enclosure, but it is understood that the remote phosphor can be mounted to within the lamp in many different ways. FIG. 9 shows another embodiment of lamp 90 comprising a base 92, a light source 94, an enclosure 96 and a remote phosphor 98, similar to those described above. In this embodiment, the remote phosphor is mounted within the enclosure by rigid supports 99 that pass from the base to the remote phosphor 98. The supports hold the remote phosphor above the light source 94 so that light from the light source passes into the remote phosphor, while holding the remote phosphor a sufficient distance from the light source 94 to avoid the transfer of heat from to the remote phosphor from the light sources. In some embodiments the supports 99 can also be made of a material that resists the transfer of heat from the base 92 to the remote phosphor 98.

Figure 10:
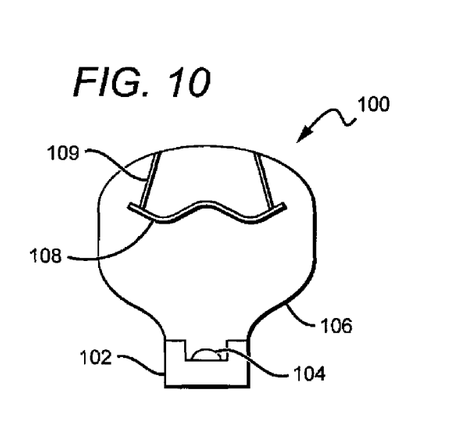
FIG. 10 is a sectional view of still another embodiment of a lamp according to the present invention.

FIG. 10 shows another embodiment of a lamp 100 having a base 102, a light source 104, an enclosure 106 and a remote phosphor 108 similar to those described above. In this embodiment, however, the remote phosphor 108 is held above the light source 104 by a mechanism 109 that passes between the top surface of the enclosure and suspends the remote phosphor 108 above the light source 104. Many different mechanisms can be used such as brackets, wires, chains or other supports. Like the embodiments above, the remote phosphor is held a sufficient distance from the light source to minimize heat transfer from the light source 104 to the remote phosphor 108.

Figure 11:
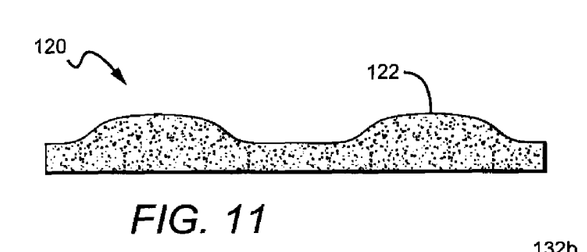
FIG. 11 is a sectional view of still another embodiment of a remote phosphor according to the present invention.
Figure 12:
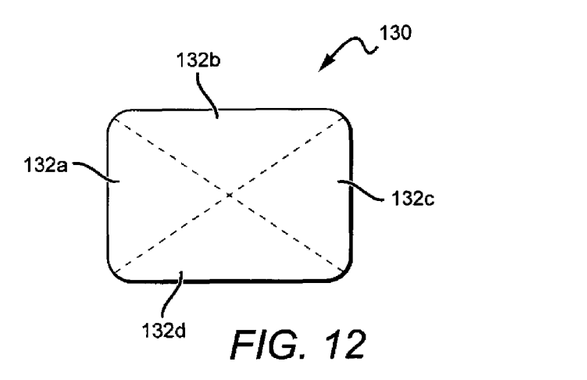
FIG. 12 is a top view of still another embodiment of a remote phosphor according to the present invention.

As mentioned above, the remote phosphors can be arranged in many different ways. FIG. 11 shows another embodiment of a remote phosphor 120 having regions with different thicknesses, with thicker regions 122 providing angled surfaces to promote sideways emission. The phosphor material can have a uniform concentration throughout or can have different concentration, such as reduced concentration in the thicker region 122 so that light source light passes through similar amounts of conversion material when passing through the thinner or thicker regions. In other embodiments, the thicker regions can have hollow portions so that light source light passes through similar amounts of conversion material in different regions. FIG. 12 shows still another embodiment of a remote phosphor 130 according to the present invention having different regions 132a-d with different types of conversion materials, or with no conversion material. It is understood that the different regions can have many different shapes and sizes and can contain many different conversion materials to generate the desired lamp emission.

Figure 13:
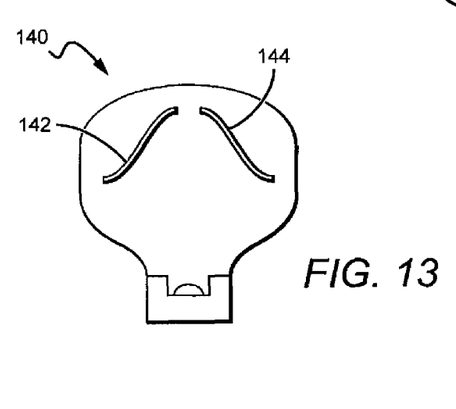
FIG. 13 is a sectional view of another embodiment of a lamp according to the present invention having two remote phosphors.

It is also understood that lamps according to the present invention can also have more than one remote phosphor, with the multiple phosphors arranged in different ways. FIG. 13 shows one embodiment of a lamp 140 according to the present invention having two remote phosphors 142, 144 mounted within the lamp enclosure. The remote phosphors 142, 144 can have the same or similar shapes and can have the same or different conversion materials arranged in different ways. Other lamps according to the present invention can have more than two remote phosphors.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. Therefore, the spirit and scope of the invention should not be limited to the versions described above.

We claim:

1. A solid state lighting (SSL) luminaire, comprising:
    a solid state light source;
    a remote phosphor mounted in relation to said light source so that light from said light source passes through said remote phosphor where at least some of said light source light is converted, said remote phosphor having an open compound shape.

2. The luminaire of claim 1, wherein said remote phosphor comprises a phosphor in a binder.

3. The luminaire of claim 1, wherein said remote phosphor has regions with different concentrations of phosphors.

4. The luminaire of claim 1, wherein said remote phosphor comprises more than one type of phosphor.

5. The luminaire of claim 1, wherein said remote phosphor comprises different phosphors in different regions.

6. The luminaire of claim 1, further comprising a base and an enclosure.

7. The luminaire of claim 1, wherein said remote phosphor has no surfaces that face each other.

8. The luminaire of claim 1, wherein said remote phosphor has a hyperbolic paraboloid shape.

9. The luminaire of claim 1, wherein the remote phosphor has different thicknesses.

10. The luminaire of claim 1, wherein said remote phosphor is substantially planar and has curves or bends.

11. The luminaire of claim 1, emitting a white light combination from said light source and said remote phosphor.

12. A lamp, comprising:
    a light emitting diode (LED); and
    a remote conversion material mounted in relation to said LED so that light from said LED passes through said conversion material where at least some of said LED light is absorbed and re-emitted at a different wavelength, and conversion material mounted a sufficient distance from said LED so that heat from said LED does not pass into said conversion material, wherein said conversion material has angled surfaces in a shape that minimizes re-emitted light passing into said conversion material.

13. The lamp according to claim 12, wherein said remote conversion material is fixed in a binder.

14. The lamp according to claim 12, wherein said conversion material is in a compound and open shape.

15. The lamp according to claim 12, wherein said conversion material is in a hyperbolic paraboloid shape.

16. The lamp of claim 12, wherein said remote phosphor has no surfaces that face each other.

17. A solid state lighting (SSL) luminaire, comprising:
    a solid state light source mounted in a base;
    an enclosure mounted in relation to said base so that light from said light source emits into said enclosure; and
    a remote phosphor mounted in said enclosure with at least some light from said light source passes into said remote phosphor where at least some of said light is absorbed and re-emitted at a different wavelength, said remote phosphor mounted a sufficient distance from said light source so substantially no heat from said light source passes into said remote phosphor, wherein said remote phosphor has a shape that minimizes re-emitted light passing back into said conversion material.

18. The luminaire of claim 17, wherein said enclosure is mounted to said base.

19. The luminaire of claim 17, wherein said base can be mounted to a standard light bulb socket.

20. The luminaire of claim 17, wherein said base comprises a power converter.

21. The luminaire of claim 17, wherein said light source comprises a light emitting diode (LED).

22. The luminaire of claim 17, wherein said remote phosphor comprises a conversion material fixed in a binder.

23. The luminaire of claim 17, wherein said remote phosphor has a compound and open shape.

24. The luminaire of claim 17, wherein said conversion material has a hyperbolic paraboloid shape.

25. A solid state lighting (SSL) luminaire, comprising:
    a light emitting diode (LED) mounted in a base;
    an enclosure mounted in relation to said base so that light from said LED emits into said enclosure; and
    a remote phosphor mounted in said enclosure with at least some light from said LED passes into said remote phosphor where at least some of said light is absorbed and re-emitted at a different wavelength and passes through said enclosure, wherein said remote phosphor has an open compound shape.

26. The luminaire of claim 25, wherein said remote phosphor has a shape that minimizes re-emitted light passing back into said remote phosphor.

27. The luminaire of claim 25, wherein said remote phosphor is mounted a sufficient distance from said LED so that substantially no heat from said LED passes into said remote phosphor.

28. The luminaire of claim 1, wherein said remote phosphor is and mounted a sufficient distance from said light source so that substantially no heat from said light source passes into said remote phosphor.

\* \* \* \* \*